United States Patent
Yoshimine et al.

(10) Patent No.: US 8,153,891 B2
(45) Date of Patent: Apr. 10, 2012

(54) SOLAR CELL AND SOLAR CELL MODULE

(75) Inventors: Yukihiro Yoshimine, Kobe (JP);
Shigeharu Taira, Amagasaki (JP);
Yasufumi Tsunomura, Takasago (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 677 days.

(21) Appl. No.: 12/162,502

(22) PCT Filed: Jan. 23, 2007

(86) PCT No.: PCT/JP2007/050992
§ 371 (c)(1),
(2), (4) Date: Sep. 4, 2008

(87) PCT Pub. No.: WO2007/088751
PCT Pub. Date: Aug. 9, 2007

(65) Prior Publication Data
US 2009/0044856 A1    Feb. 19, 2009

(30) Foreign Application Priority Data

Jan. 31, 2006   (JP) ................................. 2006-021671
Jan. 31, 2006   (JP) ................................. 2006-021700

(51) Int. Cl.
*H01L 31/00* (2006.01)
*H01L 31/042* (2006.01)
*H01L 27/146* (2006.01)
*C08L 83/04* (2006.01)

(52) U.S. Cl. ........ 136/256; 136/244; 257/448; 257/459; 524/588

(58) Field of Classification Search ................... 136/256, 136/244; 257/44, 53, 448, 459; 524/588
See application file for complete search history.

(56) References Cited

U.S. PATENT DOCUMENTS

| | | | |
|---|---|---|---|
| 6,706,961 B2 * | 3/2004 | Shimizu et al. | 136/256 |
| 2003/0216505 A1 * | 11/2003 | Akiba et al. | 524/588 |

FOREIGN PATENT DOCUMENTS

| | | |
|---|---|---|
| JP | 02-155113 | 6/1990 |
| JP | 07-188391 | 7/1995 |
| JP | 11-103084 | 4/1999 |
| JP | 2000-215729 | 8/2000 |
| JP | 2002-133948 | 5/2002 |
| JP | 2003-223813 | 8/2003 |
| JP | 2004-134775 | 4/2004 |
| JP | 2004-235287 | 8/2004 |
| JP | 2005-217148 | 8/2005 |
| JP | 2005217148 A * | 8/2005 |

* cited by examiner

*Primary Examiner* — Alexa Neckel
*Assistant Examiner* — Marla D McConnell
(74) *Attorney, Agent, or Firm* — Marvin A. Motsenbocker; Mots Law, PLLC

(57) ABSTRACT

A solar cell according to the present invention includes: a photoelectric conversion part having a photoelectric converting function; and a collector electrode provided at a side of a light-receiving surface of the photoelectric conversion part in a way that parts of the light-receiving surface are exposed. Interconnection tabs are connected at a side of a light-receiving surface of the collector electrode with an adhesive being interposed in between. The collector electrode contains a thermosetting first resin, an conductive material and a second resin for forming a sea-island structure between the second resin and the first resin. The collector electrode includes an internal region in the inside, a concentration ratio of the second resin to the first resin being higher in the internal region than in the surface region at the side of either the adhesive or the photoelectric conversion part.

9 Claims, 5 Drawing Sheets

SOLAR CELL AND SOLAR CELL MODULE

TECHNICAL FIELD

The present invention relates to a solar cell and a solar cell module, and particularly to a technology for enhancing the yields and reliability.

BACKGROUND ART

A solar cell directly converts light emitted from the Sun as a source of clean and inexhaustibly-supplied energy to electricity and, therefore is expected as a new energy source.

Each of such solar cells outputs electric power of only several watts. For this reason, in a case where solar cells are to be used as a source of electric power for a house, a building or the like, those solar cells are generally used in solar cell module including multiple solar cells electrically connected one to another in series or in parallel by conductive connecting members termed as tabs.

In general, tabs are connected to a collector electrode provided beforehand on a connecting surface of a solar cell by soldering. In a case where the material constituting the connecting surface of the solar cell is made up of ingredients, such as single-crystal silicon and polycrystalline silicon, which are resistant to relatively high heat, the collector electrode is formed of an conductive ceramic paste. In a case where the material constituting the connecting surface is made up of ingredients, such as amorphous semiconductor materials, which are not so resistant to heat, the collector electrode is formed of an conductive resin paste. As this conventional type of conductive resin paste, an conductive rein paste containing an epoxy resin is described in JP-A2005-217148.

DISCLOSURE OF THE INVENTION

In general, a solar cell module is set up outdoor, for example, on the roof of a house, and continues to be used for a long time and, therefore is susceptible to change in the environment, such as temperature change and humidity change. The solar cell module is susceptible particularly to temperature change, because the solar cell module is configured by various members having different thermal expansion coefficients. The various members include: a glass arranged on the light-receiving side of the solar cell module; a solar cell composed of semiconductor materials such as Si (silicon); a weather-resistant resin film arrange on the back side of the solar cell module a resin sealing member to seal the solar cell in the inside; metallic tabs to connect the solar cell to one another; and the like. For this reason, over a long-time continued use of the solar cell module, stress is accumulated in a contact interface between each neighboring two of the members each in which internal stress is generated due to thermal change. As a result, the adhesion decreases in the contact interface between two different materials, for example, in the contact interface between the connecting surface of each solar cells and the collector electrode, and in the contact interface between the collector electrode and the solder. This is likely to cause a problem such as an increase of contact resistance between the solar cells and the corresponding tabs, or separation of a tab.

With this taken into consideration, an object of the present invention is to provide a solar cell and a solar cell module which are less susceptible to such change in the environment, and which have an increased and long-lasting reliability.

A first characteristic of the present invention has a following gist. The solar cell includes: a photoelectric conversion part having a photoelectric converting function; and a collector electrode provided at the side of a light-receiving surface of the photoelectric conversion part in a way that parts of the light-receiving surface are exposed. Interconnection tabs are connected at a side of a light-receiving surface of the collector electrode with an adhesive being interposed in between. The collector electrode contains a thermosetting first resin, an conductive material and a second resin for forming a sea-island structure between the second resin and the first resin. The collector electrode includes an internal region in its inside, a concentration ratio of the second resin to the first resin being higher in the internal region than in its surface region at the side of either the adhesive or the photoelectric conversion part.

According to the present invention, the collector electrode contains the thermosetting first resin and the second resin for forming the sea-island structure between the second resin and the first resin. In addition, the collector electrode includes, in its inside, the region in which the concentration ratio of the second resin to the first resin is higher than the concentration ratio in its surface region at the side of either the adhesive or the photoelectric conversion part. This makes it possible to reduce internal stress in the region in which the concentration ratio of the second resin to the first resin is higher. As a result, in this region, stress applied to the collector electrode due to change in the environment and the like can be reduced. For this reason, according to the present invention, excess accumulation of stress in the collector electrode can be checked even when the stress is applied to the collector electrode due to the change in the environment. Therefore, there can be provided a solar cell in which trouble, such as a tab separation occurring due to excess accumulation of stress in the collector electrode, is suppressed.

Under the first characteristic of the present invention, the first resin may be an epoxy resin, and the second resin may be a silicone resin.

"Forming the sea-island structure between the second resin and the first resin" means that, while immiscible with the first resin, parts of the second resin are dispersed in a form of islands in the first resin holding a majority. In the collector electrode according to the present invention made up of the conductive resin paste containing the thermosetting first resin, the second resin having the sea-island structure between the second resin and this first resin and the conductive material, the sea-island structure is formed in a larger volume in the region in which the concentration ratio of the second resin to the first resin is larger. As a result, the bond which holds together portions of the first resin is shattered by the second resin in this region. This reduces the internal stress, and leads to reduction of stress applied to this region from the outside. As the second resin of this kind, a resin which is less mutually soluble with the first resin may be used.

Under the first characteristic of the present invention, the collector electrode may include, in its inside, an internal region in which the concentration ratio of the second ratio to the first ratio is larger than in the surface region at the side of the light-receiving surface.

According to the present invention, the collector electrode includes the internal region, where the concentration ratio of the second resin to the first resin is higher, in a location inward of its surface region at the side of the light-receiving surface. For this reason, when the tabs are adhered to a light-receiving-surface-side surface region of the collector electrode with an adhesive, the adhesion between the collector electrode and the adhesive is no longer reduced and can be desirably maintained.

Under the first characteristic of the present invention, the solar cell may further include a transparent conductive film provided on the light-receiving surface of the photoelectric conversion part. In addition, the collector electrode may be provided on a light-receiving surface of the transparent conductive film in a way that parts of transparent conductive film are exposed. Furthermore, the collector electrode includes, in its inside, the internal region in which the concentration ratio of the second resin to the first resin is higher than in its surface region at the side of the transparent conductive film.

According to the present invention, the collector electrode includes the internal region, where the concentration ratio of the second resin to the first resin is higher, in a location inward of its surface region at the side of the transparent conductive film. For this reason, the adhesion between the collector electrode and the transparent conductive film is no longer reduced and can be desirably maintained.

Under the first characteristic of the present invention, a light-receiving-surface-side surface region of the collector electrode may include a region in which the concentration ratio of the second resin to the first resin is lower than in the internal region.

According to the present invention, the collector electrode includes the region in which the concentration ratio of the second resin to the first resin is lower than in the internal region. For this reason, when the tabs are adhered to a light-receiving-surface-side surface region of the collector electrode with solder, the adhesion between the collector electrode and the solder is no longer reduced. As a result, the adhesion between the collector electrode and the tabs can be desirably maintained.

A solar cell module formed by the sealing of a plurality of solar cells between a glass and a resin film with a sealing member, the plurality of solar cells being electrically connected one to another with interconnection tabs. The second characteristic thereof has the following gist. Each of the solar cells includes a photoelectric conversion part having a photoelectric converting function, and a collector electrode provided at the side of the light receiving surface of the photoelectric conversion part. The collector electrode includes a thermosetting first resin, an conductive material and a second resin for forming a sea-island structure between the second resin and the first resin, and includes, in its inside, an internal region in which the concentration ratio of the second resin to the first resin is higher than in its surface region at the side of the light-receiving surface. The interconnection tabs are bonded to the surface region of the collector electrode with solder.

A third characteristic of the present invention is a solar cell module formed by the sealing of a plurality of solar cells between a glass and a resin film with a sealing member, the plurality of solar cells being electrically connected one to another with interconnection tabs. The third characteristic thereof has the following gist. Each of the solar cells includes a photoelectric conversion part having a photoelectric converting function, a transparent conductive film provided on a light-receiving surface of the photoelectric conversion part, and a collector electrode provided on a light-receiving surface of the light receiving surface of the transparent conductive film in a way that parts of the transparent conductive film are exposed. The collector electrode includes a thermosetting first resin, an conductive material and a second resin for forming a sea-island structure between the second resin and the first resin, and includes, in its inside, an internal region in which the concentration ratio of the second resin to the first resin is higher than in its surface region at the side of the transparent conductive film.

BEST MODES FOR CARRYING OUT THE INVENTION

First Embodiment

Figure 1A:
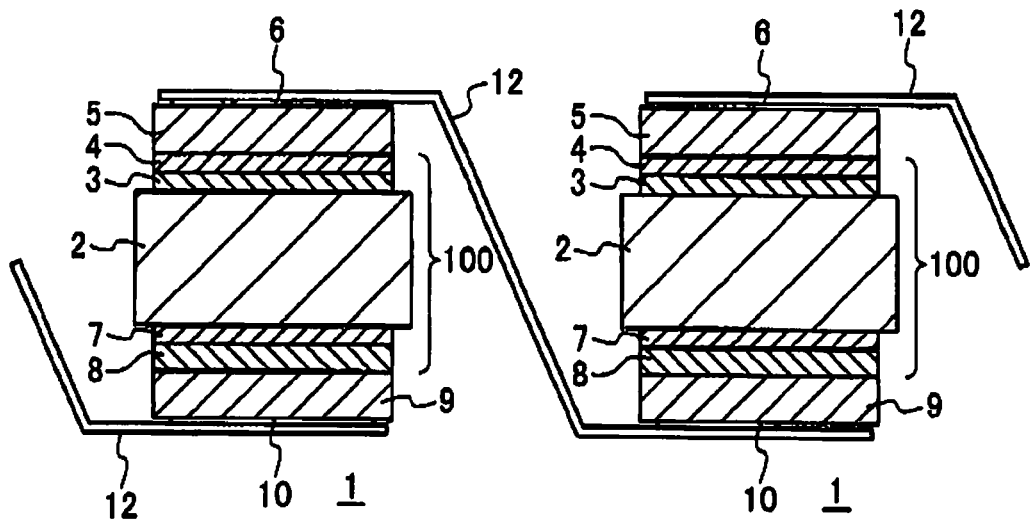
FIG. 1 is a structural drawing for explaining a solar cell according to the present invention.

Descriptions will be provided hereinafter for a first embodiment of the present invention by referring to the drawings.

<Structure of Solar cell 1>

Figure 1B:
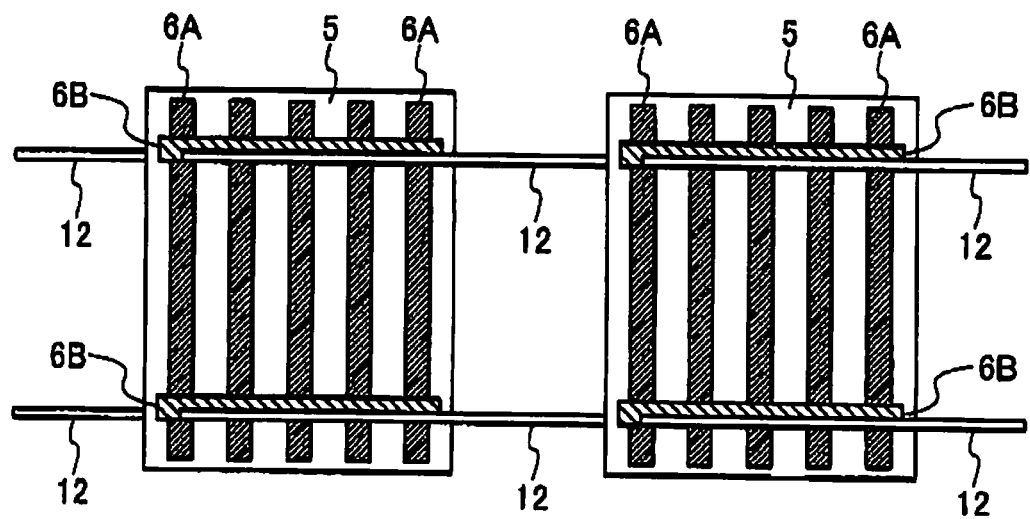

FIG. 1 is a structural drawing for showing a solar cell 1 according to the present embodiment. FIG. 1(A) is a cross-sectional structural drawing. FIG. 1(B) is a plan view viewed from the light-incidence side. Note that FIG. 1(A) is the cross-sectional structural drawing of the solar cell 1 taken in the longitudinal direction of a bus bar 6B shown in FIG. 1(B).

The solar cell 1 shown in FIG. 1 is an example of a solar cell having amorphous semiconductor layers in its connecting surfaces to which tabs 12 are bonded, respectively.

A substantially-intrinsic semiconductor (i type) amorphous silicon layer 3 and a p type amorphous silicon layer 4 are sequentially stacked on a principal surface of an n type single-crystal silicon substrate 2. In addition, a substantially-intrinsic semiconductor (i type) amorphous silicon layer 7 and an n type amorphous silicon layer 8 are sequentially stacked on the other principal surface of the n type single-crystal silicon substrate 2.

The n type amorphous silicon layer 8, the substantially-intrinsic semiconductor (i type) amorphous silicon layer 7, the n type single-crystal silicon substrate 2, the substantially-intrinsic semiconductor (i type) amorphous silicon layer 3 and the p type amorphous silicon layer 4 constitute a photoelectric conversion part 100.

A transparent conductive film 5 made of indium tin oxide (ITO) and a collector electrode 6 made of an conductive resin paste are sequentially stacked on the p type amorphous silicon layer 4. A transparent conductive film 9 made of ITO and a collector electrode 10 made of an conductive resin paste are sequentially stacked on n type amorphous silicon layer 8.

The photoelectric conversion part 100, the transparent conductive film 5, the transparent conductive film 9, the collector electrode 6, the collector electrode 10 constitute the solar cell 1 according to the present embodiment.

In the solar cell 1 of this type, incident light passes the collector electrode 6 and the transparent conductive film 5, and subsequently is made incident in the direction of the n type single-crystal silicon substrate 2 from the p type amorphous silicon layer 4. For the purpose of making the incident light incident on the n type single-crystal silicon substrate 2 effectively, the collector electrode 6 located on the light-incidence side is provided so as to expose a part of the transparent conductive film 5. Specifically, as shown in FIG. 1(B), the collector 6 is composed of: multiple rectangular finger parts 6A, 6A, . . . having a long and narrow shape and being mutually in parallel; and bus bars 6B, 6B each for electrically connecting the finger parts 6A, 6A, . . . . Accordingly, the incident light enters the photoelectric conversion part 100 from the surface of the transparent conductive film 5 which is exposed to the outside through these finger parts 6A, 6A, . . . and the bus bars 6B, 6B.

For the purpose of increasing the area of a plane on which the incident light falls, the finger parts 6A, 6A, . . . are formed as narrow as possible. On the other hand, the bus bars 6B, 6B are formed so as to be as wide as, or wider than, each tab 12 for the purpose of the bonding of the tabs 12.

The collector electrode 10 located closer to the n type amorphous silicon layer 8 is arranged opposite of the n type single-crystal silicon substrate 2 from the light-incident surface. For this reason, the collector electrode 10 may be formed on the entire transparent conductive film 9. Otherwise, like the collector electrode 6 arranged on the light-incidence side, the collector electrode 10 may be composed of multiple finger parts 6A, 6A, . . . and bus bars 6B, 6B.

Each tab 12 is a flexible conductive member of a thin film or the like made of a metal such as copper. Ends of the tabs 12 are bonded to the respective bus bars 6B in the collector electrode 6 in one of each two neighboring solar cell 1 by solder (or an adhesive). The other ends of the tabs 12 are bonded to the collector electrode 10 in the other of each two neighboring solar cell 1 by solder (or an adhesive). Thereby, each two neighboring solar cells 1 are electrically connected to each other.

Figure 2:
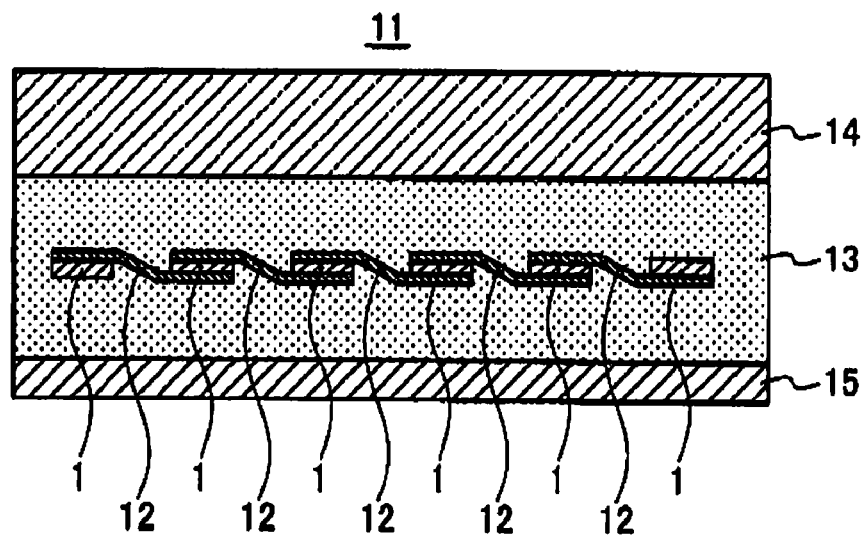
FIG. 2 is a cross-sectional view showing a structure of a solar cell module using the solar cell shown in FIG. 1.

As shown by the cross-sectional structural drawing of FIG. 2, multiple solar cells 1 electrically connected one to another with the tabs 12 are sealed in the inside of a sealing member 13 made of a resin material while being held between a light-incidence-side supporting member 14 and a rear member 15. The light-incidence-side supporting member 14 is arranged on the light-incidence side, and is made of glass or the like. The rear member 15 is made of a weather-resistant film. Thereby, a solar cell module is made up.

<Structure of Collector Electrode 6>

Figure 3:
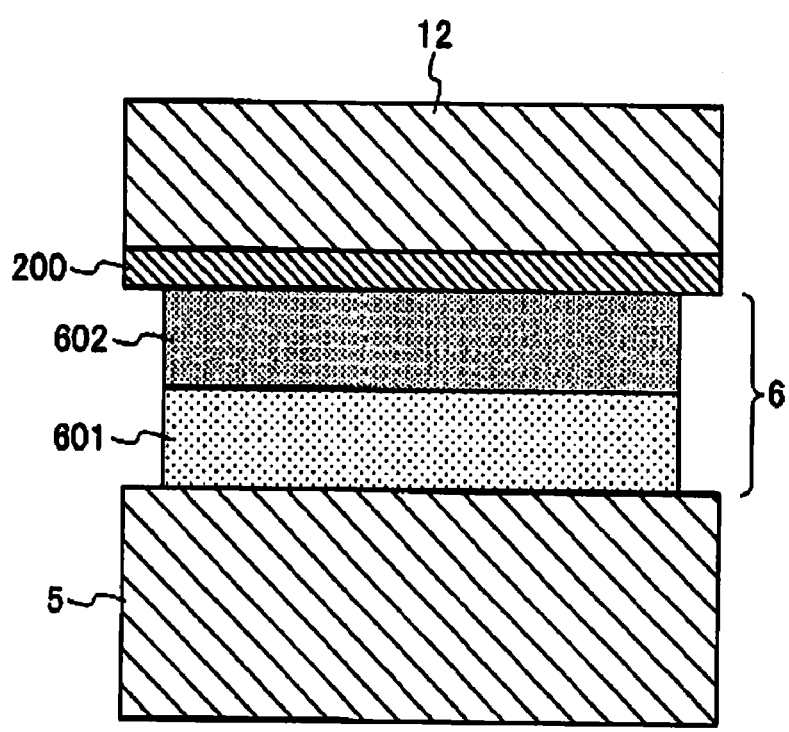
FIG. 3 is a cross-sectional view of a collector electrode of a solar cell according to a first embodiment of the present invention.

Next, detailed descriptions will be provided for a structure of the collector electrode 6 which is a characteristic part of the present invention. FIG. 3 is a magnified, cross-sectional structural drawing for explaining the structure of the collector electrode 6 arranged in the light-incidence side.

As shown in FIG. 3, the collector electrode 6 according to the present embodiment has a two-layer structure including: a first layer 601 arranged on the transparent conductive film 5; and a second layer 602 arranged on a solder layer 200, made of solder, for bonding the collector electrode 6 and the tabs 12.

Each of the first layer 601 and the second layer 602 is made of a resin-type conductive paste including; an conductive material (an conductive filler); a thermosetting resin (a first resin according to the present invention); and a second resin which forms a sea-island structure between the second resin and the thermosetting resin. The first resin and the second resin are made in a way that the concentration ratio of the second resin to the first resin is higher in the first layer 601 arranged at the side of the transparent conductive film 5 located on the other side of the first layer 601 from the solder layer 200 than in the second layer 602 arranged on the solder layer 200.

<Operation/Working-Effects>

Therefore, according to the present embodiment, the sea-island structure is formed in a larger volume in the first layer 601 than in the second layer 602. This results in a weaker adhesion of the thermosetting resins than in the second layer 602. As a result, the present invention brings about an effect of reducing stress between the transparent conductive film 5 and the tabs 12 each in which internal stress is accumulated over a long-time use of the solar cell module.

Next, description will be provided concretely for the effects of the present invention.

<Experiment 1>

Descriptions will be provided hereinbelow for a result of examination on effects of the second resin according to the present invention on the internal stress in the electrode.

First of all, an i type amorphous silicon layer with a thickness of 50 Å, a p type amorphous silicon layer with a thickness of 50 Å and an ITO film with a thickness of 50 Å were sequentially formed on the front surface of an n type single-crystal silicon substrate having a texture surface. Subsequently, an electrode with a thickness of 10 μm and an electrode with a thickness of 50 μm were formed, on the respective ITO films, of an conductive resin paste containing: a bisphenol A epoxy resin as the first resin according to the present invention; and a silicone resin as the second resin according to the present invention, which formed a sea-island structure between the second resin and the first resin. Note that, as the conductive filler, 50 wt % of globular silver powder with a particle size of 1 μmØ to 5 μmØ and 50 wt % of flaked silver powder with a particle size of 5 μmØ to 20 μmØ were contained in the conductive paste.

Thereafter, the internal stresses in the electrodes in the samples in which the electrodes were formed were examined, respectively, in the following manner by changing the concentration of the silicone resin in the conductive paste between 0 wt % to 20 wt % inclusive.

The acoustoelastic method and the like are known as a method of precisely measuring internal stress. Here, however, for the purpose of examining the internal stress on the surface of each silicon substrate in which a concave-convex texture surface was formed, a lattice pattern cutting method (in compliance with JIS K 5400) was used to examine the tab separation status. Thereby, the internal stress in the electrode was evaluated.

The lattice pattern cutting method is that which is carried out as follows. A test piece is scratched in a lattice pattern at predetermined intervals. Thereby, the scratch status is visually observed and the status (for example, the area of a damaged and lost part) is evaluated on a scale of one to ten. In this experiment, a substrate with a size of 125 mm×125 mm was used for each sample, and an electrode with a size of 30 mm×30 mm was formed thereon for each sample. Subsequently, 11 cuts were made at intervals of 1 mm in the center and its vicinity on the surface thereof for each sample, and another 11 cuts were made at intervals of 1 mm so as to cross the other 11 cuts. Thereby, a total of 100 squares were made within the range of 10 mm 10 mm for each sample. Subsequently, their separation statuses were evaluated.

By the foregoing lattice pattern cutting method, comparisons of the damage and loss statuses were made between the sample in which the electrode had been formed with the thickness of 10 μm and the other sample in which the electrode had been formed with the thickness of 50 μm. If there is a big difference between the two, a judgment was made that the internal stresses of the respective electrodes were high. The reason for this judgment was as follows.

Two types of separation of the electrode formed on the ITO film are assumed: a separation caused by a low adhesion between the ITO film and the electrode; and a separation caused by an increased internal stress inside the electrode. Accordingly, in this experiment, the separation caused by a high internal stress inside the electrode was evaluated by comparing the separation statuses of the two types of samples each having a different thickness. In other words, in a case of low adhesion between the ITO film and the electrode, the separation status will not vary so much between the samples each having a different thickness, since both the two types of samples each having a different thickness show considerable separations. On the other hand, in a case of high adhesion between the ITO film and the electrode, the separation is caused by an internal stress inside the electrode appears. In this respect, it is generally known that internal stress in a film increases as the film becomes thicker. For this reason, an increased thickness causes a separation to easily occur in a sample having a high internal stress inside its film, although a small thickness does not cause the separation to occur easily. This results in a big difference in the separation status between the sample with a small thickness and the sample with a large thickness.

Specifically, by the foregoing lattice pattern cutting method, the separation statuses were visually observed and rated on a scale of 0 point to 10 points. In a case where the point difference between the sample having the 10-μm-thick film and the sample having the 50-μm-thick film was zero, the internal stress was judged as being low; 2, intermediate; and 4 or more, high. In Table 1, "Concentration of Silicone resin" (weight %, hereinafter shortened to wt %) in the experiment means the concentration ratio of the silicone resin to the epoxy resin.

As shown in this table, the increase in the concentration of the silicone resin in the conductive paste enabled reduction of the internal stress inside the electrode. One may consider this as coming from the following reason. As described above, the sea-island structure was formed (or the silicone resin formed "island" portions) inside the paste due to the low mutual solubility between the epoxy resin and the silicone resin when the epoxy resin and the silicone resin were mixed together. As a result, the internal stress inside the epoxy resin was divided by the silicone resin. This division decreased the internal stress in the entire resin.

Accordingly, not only the silicone resin but also any material which is less mutually soluble with the epoxy resin is capable of forming a sea-island structure in the paste. For this reason, such a less mutually soluble material is capable of reducing the internal stress in the electrode produced of this conductive paste.

Judging from the table, when the concentration of the silicone resin is 5 wt % or higher, the concentration enables the internal stress to be lower. The concentration of the silicone resin should preferably be 20 wt % or higher.

TABLE 1

CONCENTRATION OF SILICONE RESIN IN PASTE AND INTERNAL STRESS

| CONCENTRATION OF SILICONE RESIN | INTERNAL STRESS |
| --- | --- |
| 0 wt % | HIGH |
| 5 wt % | INTERMEDIATE |
| 10 wt % | INTERMEDIATE |
| 20 wt % | LOW |

<Experiment 2>

Next, descriptions will be provided for effects of the second resin according to the present invention on the adhesion to the solder.

Also in this experiment, each electrode was formed of the conductive resin paste containing the bisphenol A epoxy resin as the first resin and the silicone resin as the second resin. Note that, also in this experiment, as the conductive filler, 50 wt % of globular silver powder with a particle size of 1 μmØ to 5 μmØ and 50 wt % of flaked silver powder with a particle size of 5 μmØ to 20 μmØ were contained in the conductive paste.

Each sample was prepared by forming its electrode by changing the concentration of the silicone resin in the conductive paste within the range of 0 wt % to 30 wt %. A tab made of copper foil was soldered to the surface of each electrode. Thereafter, the tab was peeled off from the surface thereof. Subsequently, an experiment was performed on the adhesion of the solder by visually observing the soldered surface of the tab. Specifically, the degree of adhesion of the solder was rated by evaluating the ratio of the area of a part where the solder of the tab was alloyed with the silver paste in the collector electrode due to heat at the time of soldering. As the area ratio of the alloyed part becomes higher, the adhesion of the tab can be judged as being higher.

Table 2 shows the relationship between the concentration of the silicone resin in the conductive paste and the adhesion of the solder (the ratio of the area of an alloyed part based on a visual observation) in this experiment. As shown in the table, it is learned that a more reduced concentration of the silicone resin in the conductive paste enables more enhanced adhesion of the solder. Note that, in the table, "Concentration of Silicone resin" (unit: wt %) means the concentration ratio of the silicone resin to the epoxy resin.

Judging from the table, the concentration being not more than 10 wt % of the silicone resin can lead to the solder adhesion ratio of 50% or higher. Preferably, the concentration being not more than 5 wt % of the silicone resin can lead to the solder adhesion ratio of 80% or higher.

TABLE 2

CONCENTRATION OF SILICONE RESIN IN COLLECTOR ELECTRODE AND SOLDER ADHESION

| CONCENTRATION OF SILICONE RESIN | SOLDER ADHESION |
| --- | --- |
| 0 wt % | 100 wt % |
| 5 wt % | 80 wt % |
| 10 wt % | 50 wt % |
| 20 wt % | 20 wt % |
| 30 wt % | 0 wt % |

As described above, when the electrode is formed of the conductive paste containing the thermosetting first resin, the second resin for forming the sea-island structure between the second resin and this first resin, and the conductive material, the internal stress in the electrode can be reduced by increasing the concentration of the second resin in the conductive paste. On the other hand, the adhesion of the solder at the time of bonding the tab can be enhanced by decreasing the concentration of the second resin in the conductive paste.

For this reason, if the collector electrode includes, in its inside, a region where the concentration ratio of the second resin to the first resin is higher than in the surface region on the light-incidence-surface side, this inclusion makes it possible to desirably maintain the adhesion between the collector electrode and each tab without decreasing the adhesion to the solder, and concurrently to reduce the internal stress in the electrode.

This point will be described in detail hereinbelow.
<Experiment 3>

In this experiment, each sample was prepared by sequentially forming an i type amorphous silicon layer with a thickness of 50 Å, a p type amorphous silicon layer with a thickness of 50 Å and an ITO film with a thickness of 1500 Å on an n type single-crystal silicon substrate having a texture surface, and subsequently by forming a collector electrode, with a thickness of 30 μm, of an conductive resin paste on the ITO film. Note that, as shown in FIG. 1, each electrode was formed to include multiple finger parts 6A, 6A, . . . and bus bars 6B, 6B.

Here, as the conductive paste, a paste material was used, containing: the bisphenol A epoxy resin as the first resin; the silicone resin as the second resin for forming the sea-island structure between the second resin and the first resin; and 50 wt % of globular silver powder with a particle size of 1 μmØ to 5 μmØ and 50 wt % of flaked silver powder with a particle size of 5 μmØ to 20 μmØ as the conductive filler.

Subsequently, samples for Comparative Examples 1 to 4 were prepared by forming collector electrodes, each having a single-layer structure, of resin pastes having the concentrations being 0 wt %, 5 wt %, 10 wt % and 20 wt % of the silicone resins, respectively.

Thereafter, samples for Examples 1 to 2 were prepared by forming collector electrodes each with a two-layer structure as shown in FIG. 3, respectively. The first layer (with a thickness 15 μm) at the side of ITO was formed of a resin paste in which the concentration of the silicone resin was 20 wt %, and the second layer (with a thickness of 15 μm) at the side of the solder was formed of a resin paste in which the concentration of the silicone resin was 10 wt %. The resin paste also had another concentration of 5 wt %.

Subsequently, the adhesion of the collector electrode to the solder and tab strength were measured for each sample after a tab made of copper foil was bonded to the bus bar part in the collector electrode with solder.

Figure 4:
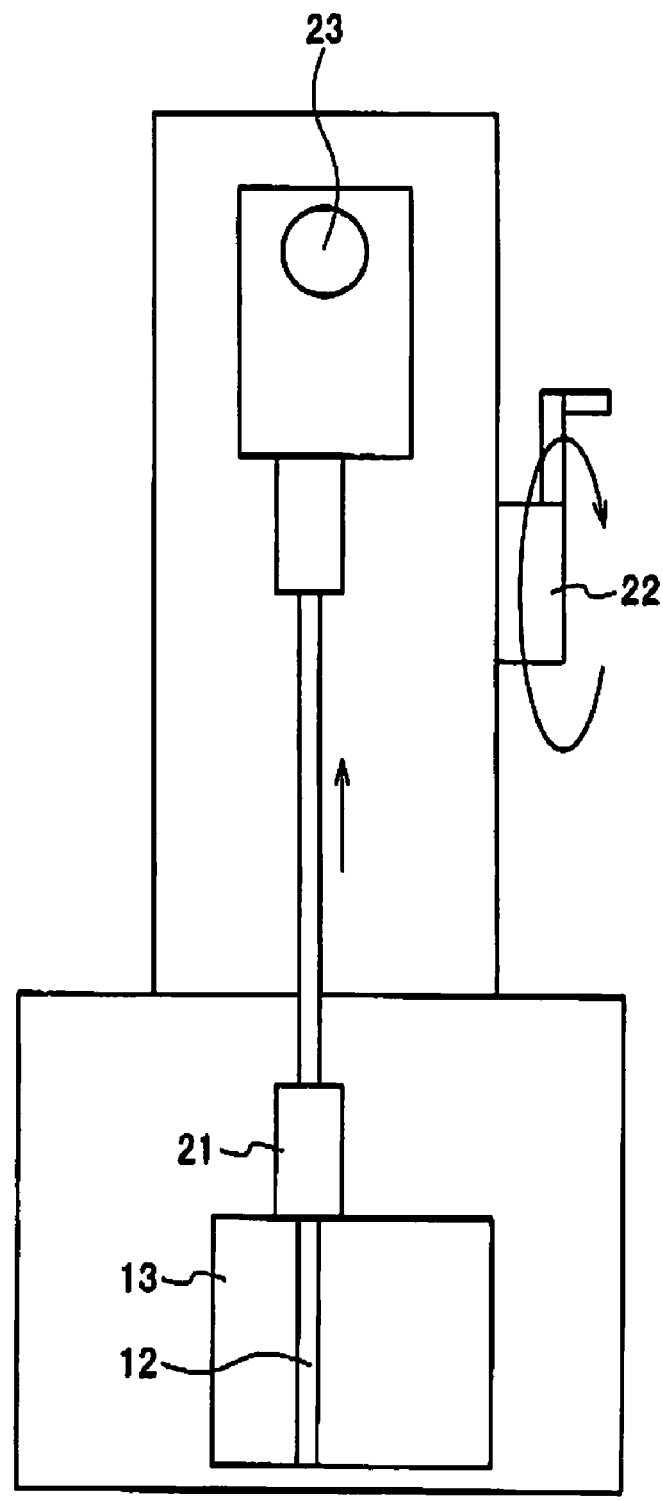
FIG. 4 is a schematic diagram for explaining an instrument for measuring the strength of a tab.

Note that the adhesion of the collector electrode to the solder was measured in the same method as in Experiment 2. The tab strength was indicated with a strength applied to the tab when a tab is separated in a way that the tab bonded to the bus bar part with solder was folded at a right angle to the surface of the substrate, and an end portion of the folded part was pulled up in a direction perpendicular to the surface of the substrate, that is, in a direction in which the tab was folded. Specifically, as shown in FIG. 4, with the sample 13 of the measurement subject being fixed onto a sample table (not illustrated) of a peeling strength measuring instrument 20, part of the tab 12 soldered onto the collector electrode (not illustrated) of the sample 13 was pinched with a clip 21. Thereafter, by turning a handle 22 of the peeling strength measuring instrument 20, the clip 21 was pulled up until the tab 12 started to come off from the sample. Subsequently, the largest value was read from the peeling strength displayed on a gauge 23 of the peeling strength measuring instrument 20 so that the tab strength was measured.

Table 3 shows the adhesion to the solder as well as the tab strength which were measured for each of Comparative Examples 1 to 4 and Examples 1 to 2. Note that, in the table, "Concentration of Silicone resin" (unit; wt %) means the concentration ratio of the silicone resin to the epoxy resin.

TABLE 3

CONCENTRATION OF SILICONE RESIN IN COLLECTOR ELECTRODE AND TAB STRENGTH

| | FIRST LAYER 601 | SECOND LAYER 602 | SOLDER ADHESION | TAB STRENGTH |
|---|---|---|---|---|
| COMPARATIVE EXAMPLE 1 | 0 wt % (15 μm) | 0 wt % (15 μm) | 100% | 0 g (NATURAL SEPARATION) |
| COMPARATIVE EXAMPLE 2 | 5 wt % (15 μm) | 5 wt % (15 μm) | 80% | 50 g |
| COMPARATIVE EXAMPLE 3 | 10 wt % (15 μm) | 10 wt % (15 μm) | 50% | 80 g |
| COMPARATIVE EXAMPLE 4 | 20 wt % (15 μm) | 20 wt % (15 μm) | 20% | 80 g |
| EXAMPLE 1 | 20 wt % (15 μm) | 10 wt % (15 μm) | 50% | 150 g |
| EXAMPLE 2 | 20 wt % (15 μm) | 5 wt % (15 μm) | 80% | 180 g |

As to the samples respectively of comparative Examples 1 to 4 each in which the collector electrode was formed with the single-layer structure, as the concentration of the silicone resin in the resin paste became higher, the adhesion to the solder decreased whereas the tab strength increased. One may consider this as coming from the following reason. As explained with regard to Experiment 1, as the concentration of the silicone resin in the resin paste became higher, the internal stress in the collector electrode decreased. As a result, the tab strength increased.

Next, in the samples of Examples 1 to 2, the collector electrode had the two-layer structure, and the concentration of the silicone resin was higher in the first layer at the side of the ITO film than in the second layer at the side of the solder. On the other hand, in the samples of Comparative Examples 2 to 3, the second layer at the side of the solder was formed of the resin paste having the same concentration of the silicone resin as of the first layer. It was learned that the samples of Examples 1 and 2 was capable of enhancing the tab strength without decreasing the adhesion of the solder in comparison with the samples of Comparative Examples 2 and 3.

Judging from the table, not more than 10 wt % of the concentration of the silicone resin can lead to the solder adhesion ratio of 50% or higher and the tab strength of 150 g. Preferably, not more than 5 wt % of the concentration of the silicone resin can lead to the solder adhesion ratio of 80% or higher and the tab strength of 180 g or more.

Note that the collector electrode in the solar cell according to the present invention is not limited to the collector electrode with the foregoing two-layer structure and may have a structure including three or more layers. This point will be described hereinbelow,
<Experiment 4>

Subsequently, a sample for Example 3 with a collector electrode including a three-layer structure shown in FIG. 5 was formed as follows.

First of all, an i type amorphous silicon layer, a p type amorphous silicon layer and an ITO film were sequentially formed on an n type single-crystal silicon substrate in the same manner as in Experiment 3.

Thereafter, a collector electrode with a three-layer structure was formed of the same resin paste as was used for Experiment 3. At this time, a first layer 603 (with a thickness of 10 μm) in contact with the ITO film was formed of a resin paste in which the concentration of the silicone resin was 5 wt %. Subsequently, a second layer 604 with a thickness of 10 μm was formed, on the first layer 603, of a resin paste in which the concentration of the silicone resin was 20 wt %. Finally, a third layer 605 with a thickness of 10 μm was formed, on the second layer 604, of a resin paste in which the concentration of the silicone resin was 5 wt %. After that, a tab made of copper foil was bonded to the top of the sample collector electrode thus formed for Example 3 with solder, and the adhesion of the solder as well as the tab strength was measured. The result of the measurement was that the adhesion of the solder was 80% and the tab strength was 200 g in the sample for Example 3. The best tab strength was obtained. One may consider this as coming from the following reason. As the compound ratio of the silicon in the first layer 603 was decreased, the adhesion between the paste and ITO could be enhanced. The synergy with the effect described with regard to Experiment 2 further increased the tab strength in comparison with Example 2.

As described above, the present invention is effective for the collector electrode with the layer structure including the three layers or more.

Second Embodiment

Descriptions will be provided hereinafter for a second embodiment of the present invention by referring to the drawings.

<Structure of Solar Cell 1>

The structure of the solar cell 1 and the solar cell module according to the present embodiment are the same as the structure of the solar cell 1 and the solar cell module according to the first embodiment. For this reason, descriptions will be omitted.

<Structure of Collector Electrode 6>

Figure 6:
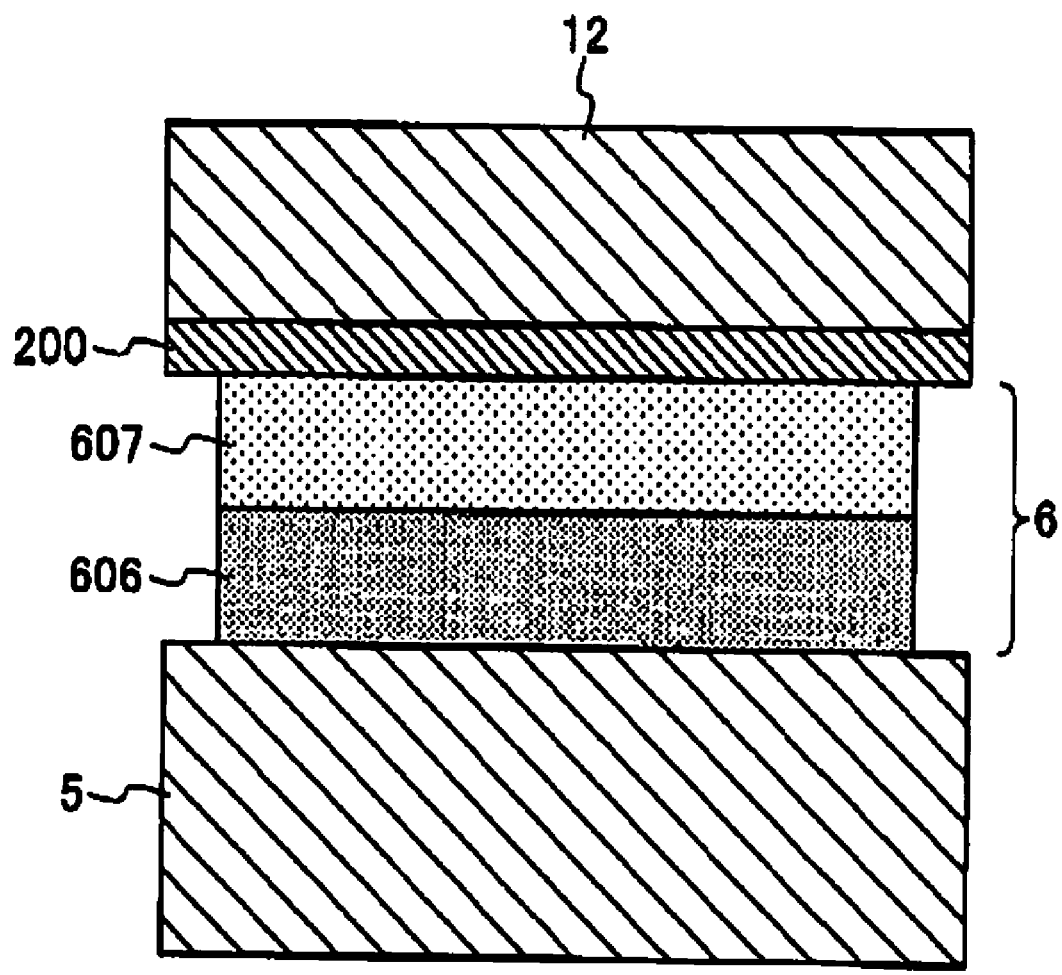
FIG. 6 is a cross-sectional view of a collector electrode of a solar cell according to a second embodiment of the present invention.

Next, detailed descriptions will be provided for a structure of the collector electrode 6 which is a characteristic part of the present invention. FIG. 6 is a magnified cross-sectional structural drawing for explaining the structure of the collector electrode which is arranged on the light-incidence side.

As shown in the drawing, the collector electrode 6 according to the present embodiment having a two-layer structure including: a first layer 606 arranged on the side in contact with the transparent conductive film 5; and a second layer 607 arranged on the side in contact with an solder layer 200 made of solder to bond a collector electrode 6 and a tab 2.

Each of the first layer 606 and the second layer 607 was formed of an conductive resin paste containing an conductive material (an conductive filler), a thermosetting resin (a first resin of the present invention) and a second resin for forming a sea-island structure between the second resin and the first resin. In addition, the collector electrode includes, in its inside, a region (the second layer 607) in which the concentration ratio of the second resin to the first resin is larger than in the first layer 606 at the side of the transparent conductive film 5.

<Operation/Working-Effects>

For this reason, according to the present embodiment, the sea-island structure is formed in a larger volume in the second layer 607 than in the first layer 606. This results in a weaker adhesion of the adjacent thermosetting resins than in the first layer 606. As a result, the present embodiment is capable of reducing, in the second layer 607, stress generated due to internal stresses respectively accumulated in the transparent conductive film 5 and the tab 12.

Next, detailed descriptions will be provided for the effects of the present invention.

<Experiment 5>

Next, descriptions will be provided hereinbelow for a result of examination on effects of the resin according to the present invention respectively on the adhesion between the electrode and the transparent conductive film as well as internal stress in the electrode.

First of all, an i type amorphous silicon layer with a thickness of 50 Å, a p type amorphous silicon layer with a thickness of 50 Å and an ITO film with a thickness of 50 Å were sequentially formed on the front surface of an n type single-crystal silicon substrate having a texture surface. Subsequently, an electrode with a thickness of 10 μm and an electrode with a thickness of 50 μm were formed, on the respective ITO films, of an conductive resin paste containing: a bisphenol A epoxy resin as the first resin according to the present invention; and a silicone resin as the second resin according to the present invention, which formed a sea-island structure between the second resin and the first resin. Note that, as the conductive filler, 50 wt % of globular silver powder with a particle size of 1 μmØ to 5 μmØ and 50 wt % of flaked silver powder with a particle size of 5 μmØ to 20 μmØ were contained in the conductive paste.

Thereafter, the internal stresses in the electrodes in the samples in which the electrodes were formed were examined, respectively, in the following manner by changing the concentration of the silicone resin in the conductive paste between 0 wt % to 20 wt % inclusive.

The acoustoelastic method and the like are known as a method of precisely measuring internal stress. Here, however, for the purpose of examining the internal stress on the surface of each silicon substrate in which a concave-convex texture surface was formed, a lattice pattern cutting method (in compliance with JIS K 5400) was used to examine the tab separation status. Thereby, the internal stress in each electrode was evaluated.

The lattice pattern cutting method is that which is carried out as follows. A test piece is scratched in a lattice pattern at predetermined intervals. Thereby, the scratch status is visually observed and the status (for example, the area of a damaged and lost part) is evaluated on a scale of one to ten.

In the experiment, a substrate with a size of 125 mm×125 mm was used for each sample, and an electrode with a size of 30 mm×30 mm was formed thereon for each sample. Subsequently, 11 cuts were made at intervals of 1 mm in the center and its vicinity on the surface thereof for each sample, and another 11 cuts were made at intervals of 1 mm so as to cross the other 11 cuts. Thereby, a total of 100 squares were made within the range of 10 mm×10 mm for each sample. Subsequently, their separation statuses were evaluated.

<Adhesion with Transparent Conductive Film>

First of all, for each sample in which the electrode was formed with the thickness of 10 μm, the adhesive between the transparent conductive film (the ITO film) and the electrode was evaluated by the lattice pattern cutting method. Specifically, the number of separations in each sample was visually counted, and the sample was rated on a scale of 0 point to 10 points. The result of the evaluation is shown in Table 4. It should be noted that, with 10 points, the adhesion was judged as being "high"; 8 points, "slightly high"; 6 points, "intermediate"; 4 points, "slightly low"; and 0 to 2 points, "low." In addition, also in the table, "Concentration of Silicone resin" means the concentration ratio of the silicone resin to the epoxy resin.

As shown in the table, it is learned that a more reduced concentration of the silicone resin in the conductive paste enables more enhanced adhesion to ITO. Preferably, the concentration being not more than 5 wt % of the silicone resin can lead to the enhanced adhesion to ITO.

TABLE 4

CONCENTRATION OF SILICONE RESIN IN COLLECTOR ELECTRODE AND ADHESION TO ITO

| CONCENTRATION OF SILICONE RESIN | ADHESION TO ITO |
| --- | --- |
| 0 wt % | HIGH |
| 5 wt % | SLIGHTLY HIGH |
| 10 wt % | SLIGHTLY LOW |
| 20 wt % | LOW |

(Internal Stress)

An effect of the second resin according the present invention on the internal stress in the electrode was examined and the same result as that of Experiment 1 was obtained. For the result of Experiment 5, see Table 1.

As described above, when the electrode was formed of the conductive paste containing the first resin, the second resin which forms the sea-island structure between the second resin and this first resin, and the conductive material, the internal stress in the electrode can be reduced by increasing the concentration of the second resin in the conductive paste. In addition, the adhesion to ITO can be enhanced by decreasing the concentration of the second resin in theconductive paste.

As a result, as in the present invention, by causing the collector electrode to include, in its inside, an internal region in which the concentration ratio of the second resin to the first resin is higher than in its surface region of the transparent conductive film, the internal stress in the electrode can be reduced and concurrently the adhesion to ITO can be enhanced.

This point will be specifically described hereinbelow.

<Experiment 6>

In this experiment, each sample was prepared by sequentially forming an i type amorphous silicon layer with a thickness of 50 Å, a p type amorphous silicon layer with a thickness of 50 Å and an ITO film with a thickness of 1500 Å on an n type single-crystal silicon substrate having a texture surface, and subsequently by forming a collector electrode, with a thickness of 30 μm, of an conductive resin paste on the ITO film. Note that, as shown in FIG. 2, each electrode was formed to include multiple finger parts 6A, 6A, . . . and bus bars 6B, 6B.

Here, as the conductive paste, a paste material was used, containing: the bisphenol A epoxy resin as the first resin; the silicone resin as the second resin for forming the sea-island structure between the second resin and the first resin) and 50 wt % of globular silver powder with a particle size of 1 μmØ to 5 μmØ and 50 wt % of flaked silver powder with a particle size of 5 μmØ to 20 μmØ as the conductive filler.

Subsequently, samples for Comparative Examples 1 to 3 were prepared by forming collector electrodes, each having a single-layer structure, of resin pastes having the concentrations being 0 wt %, 5 wt % and 10 wt % of the silicone resins, respectively. These comparative examples 1 to 3 were the same as the comparative examples 1 to 3 prepared in Experiment 3.

Thereafter, samples for Examples 4 and 5 were prepared by forming collector electrodes each having a two-layer structure shown in FIG. 6, respectively. The first layer (with a thickness 15 μm) at the side of TTO was formed of a resin paste in which the concentration of the silicone resin was 5 wt %, and the second layer at the side of the solder was formed of a resin paste in which the concentration of the silicone resin was 10 wt %. The resin paste also had another concentration of 20 wt %. In addition, a sample for Example 6 was prepared by forming the first layer (with a thickness 15 μm), at the side of ITO, of a resin paste in which the concentration of the silicone resin was 0 wt %, and by forming the second layer, at the side of the solder, of a resin paste in which the concentration of the silicone resin was 10 wt %.

Thereafter, by the foregoing lattice pattern cutting method, the separation status of the electrode was examined and a simple way of evaluating this as the adhesion to ITO was performed.

Furthermore, tab strength was measured for each sample after a tab made of copper foil was bonded to the bus bar part in the collector electrode with solder.

The tab strength was measured for each sample by the peeling strength measuring instrument 20 shown in FIG. 4 as in Experiment 3.

TABLE 5

CONCENTRATION OF SILICONE RESIN IN COLLECTOR ELECTRODE AND TAB STRENGTH

| | FIRST LAYER 606 | SECOND LAYER 607 | SOLDER ADHESION TO ITO | TAB STRENGTH |
| --- | --- | --- | --- | --- |
| COMPARATIVE EXAMPLE 1 | 0 wt % (15 μm) | 0 wt % (15 μm) | HIGH | 0 g (NATURAL SEPARATION) |
| COMPARATIVE EXAMPLE 2 | 5 wt % (15 μm) | 5 wt % (15 μm) | SLIGHTLY HIGH | 50 g |
| COMPARATIVE EXAMPLE 3 | 10 wt % (15 μm) | 10 wt % (15 μm) | SLIGHTLY WEAK | 80 g |
| EXAMPLE 4 | 5 wt % (15 μm) | 10 wt % (15 μm) | SLIGHTLY HIGH | 120 g |
| EXAMPLE 5 | 5 wt % (15 μm) | 20 wt % (15 μm) | SLIGHTLY HIGH | 150 g |
| EXAMPLE 6 | 0 wt % (15 μm) | 10 wt % (15 μm) | HIGH | 180 g |

Figure 5:
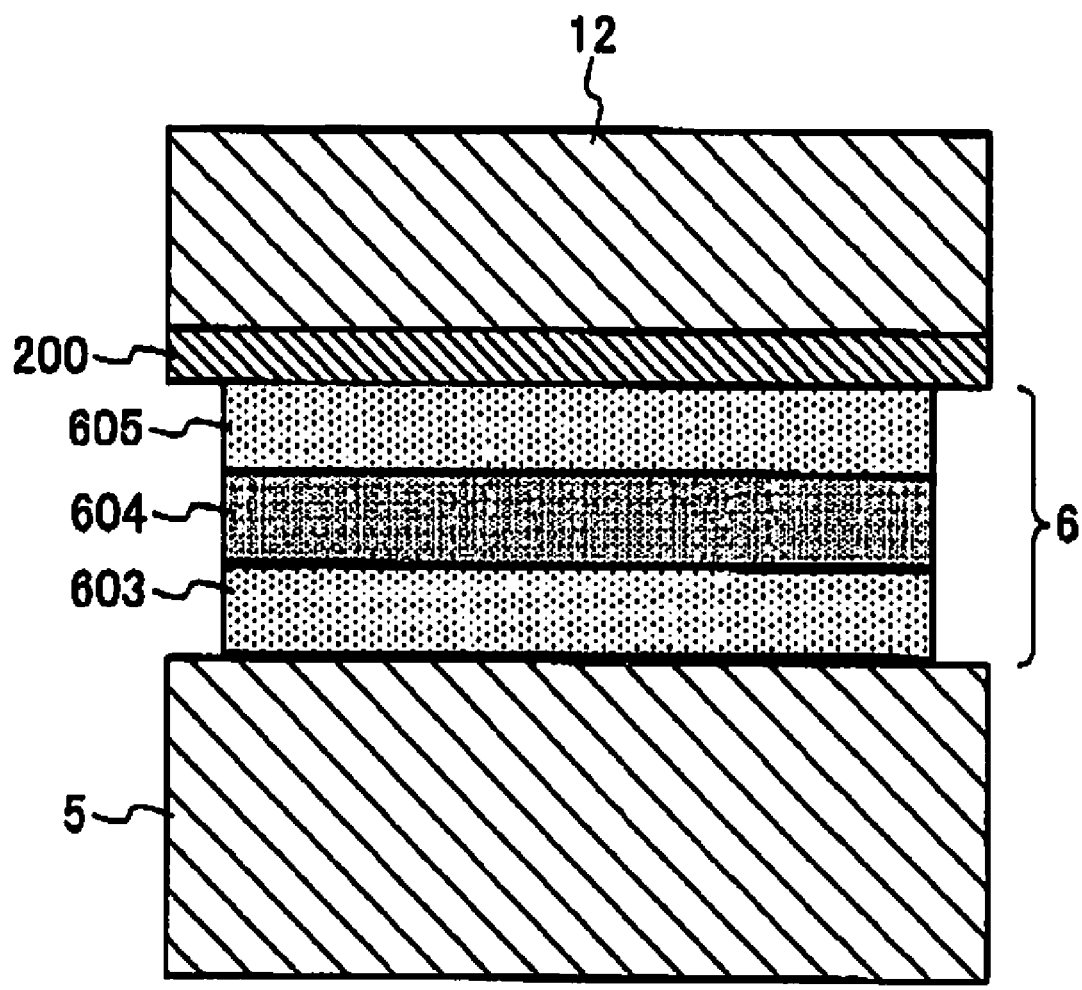
FIG. 5 is a cross-sectional view of a collector electrode with a three-layer structure in the solar cell according to the first embodiment of the present invention.

FIG. 5 shows the adhesion between the electrode and ITO and the tab strength which were measured for each of Comparative Examples 1 to 3 and Examples 4 to 6. Note that, also in the table, "Concentration of Silicone resin" (unit: wt %) means the concentration ratio of the silicone resin to the epoxy resin.

In the samples for Comparative Examples 1 to 3 each in which the collector electrode was formed with the single-layer structure, as shown in the table, a collector electrode formed to have a higher concentration of the silicone resin in the resin paste has lower adhesion to ITO, while having increased tab strength. One may consider this as coming from the following reason. As described with regard to Experiment 5, as the concentration of the silicone resin in the conductive paste was increased, the adhesion to ITO decreased, and the internal stress decreased in the collector electrode. Thereby, the decrease in the internal stress exerts an effect of stress reduction larger than the effect of the decreased adhesion. This increased the tab strength.

Subsequently, the samples were prepared for Examples 4 and 5 each with the two-layer structure obtained by forming the first layer at the side of the ITO film of the conductive paste in which the concentration of the silicone resin was 5 wt %, and concurrently by forming the second layer at the side of the solder layer of the conductive paste in which the concentration of the silicone resin was 10 wt %. The conductive paste also had another concentration of 20 wt %. These samples for Examples 4 and 5 were compared with the sample for Comparative Example 2 in which both the first layer and the second layer were formed of the conductive pasta in which the concentration of the silicone resin was 5 wt %. It was learned that, in the samples for Examples 4 and 5, the tab strength was able to be increased without decreasing the adhesion to the ITO film.

In addition, the sample for Example 6 was prepared to have the first layer at the side of the ITO film formed of the conductive paste in which the concentration of the silicone resin was 0 wt %, and the second layer at the side of the solder layer formed of the conductive resin in which the concentration of the silicone resin was 10 wt %. The sample was compared with the sample for Comparative Example 1 in which both the first layer and the second layer were formed of the conductive paste in which the concentration of the second resin was 0 wt %. It was learned that, in Example 6, the tab strength was able to be increased without decreasing the adhesion to the ITO film.

Judging from the table, the tab strength was able to be 120 g or more when the concentration of the silicone resin in the first layer was 5 wt % or lower.

From the foregoing result, it is learned that the present invention is capable of providing the solar cell having the tab strength which is increased when the tabs are bonded to the collector electrode, and the solar cell module with the increased tab strength. The provisions are achieved by forming the collector electrode of the conductive paste containing the first resin, the second resin for forming the sea-island structure between the second resin and this first resin and the conductive material, and concurrently by causing the collector electrode to include, in its inside, the internal region in which the concentration ratio of the second resin to the first resin is larger than in its surface region at the side of the transparent conductive film. As a result, the present invention is capable of providing the solar cell and the solar cell module, both which are less susceptible to a change in the environment, and both which exhibit increased reliability.

It should be noted that the collector electrode in the solar cell according to the present invention is not limited to the foregoing two-layer structure. The present invention may be applicable to a collector electrode with a structure including three layers or more. This example will be described hereinbelow.

<Experiment 7>

A sample with a collector electrode having the three-layer structure shown in FIG. 5 was prepared for Example 7.

First of all, an i type amorphous silicon layer, a p type amorphous silicon layer and an ITO layer were formed on an n type single-crystal silicon substrate in the same manner as in Experiment 6.

Subsequently, the collector electrode having the three-layer structure was formed by the same resin paste as for Experiment 6. At this time, a first layer 603 (with a thickness of 10 μm) in contact with the ITO film was formed of the resin paste in which the concentration of the silicone resin was 5 wt %. Subsequently, a second layer 604 with a thickness of 10 μm was formed, on the first layer 603, of a resin paste in which the concentration of the silicone resin was 20 wt %. Finally, a third layer 605 with a thickness of 10 μm was formed, on the second layer 604, of a resin paste in which the concentration of the silicone resin was 5 wt %. After that, a tab made of copper foil was bonded to the top of the sample collector electrode thus formed for Example 7 with solder, and the adhesion to ITO as well as the tab strength was measured. The result of the measurement was that the tab strength was 200 g in the sample for Example 7. The best tab strength was obtained. One may consider this as coming from the following reason. As the compound ratio of the silicon in the third layer 605 was decreased, the adhesion between the paste and the solder could be enhanced. The synergy with the effect described with regard to Example 6 further increased the tab strength in comparison with Example 6.

As described above, the present invention is effective for the collector electrode with the structure including the three layers or more.

Other Embodiments

In the first embodiment above, the transparent conductive film 5 made of ITO and the collector electrode 6 are sequentially stacked on the p type amorphous silicon layer 4. However, the collector electrode 6 may be stacked directly on the p type amorphous silicon layer 4 without stacking the transparent conductive film 5 thereon. Even in this case, the sea-island structure is formed in a larger volume in the first layer 601 than in the second layer 602. This enables reduction of stress between the p type amorphous silicon layer 4 and the tabs 12 each in which internal stress is accumulated. Furthermore, even in this case, the adhesion between the collector electrode and the solder is not decreased.

In addition, in the second embodiment above, the tabs 12 and the collector electrode 6 are bonded to each other by solder. However, a resin adhesive containing conductive particles may be used without using the solder. Even in this case, the sea-island structure is formed in a larger volume in the second layer 604 than in the first layer 603. This enables reduction of stress between the transparent conductive film 5 and the tabs 12 each in which internal stress is accumulated. Furthermore, even in this case, the adhesion between the collector electrode and the transparent conductive film is not decreased.

Furthermore, the foregoing embodiments each use the bisphenol A epoxy resin as the thermosetting resin. However, the thermosetting resin is not limited to this. What can be used as the thermosetting resin include: an epoxy resin containing, as an ingredient, anyone of bifunctional compounds such as stilbene-based compounds and biphenyl-based compounds; an epoxy resin containing, as an ingredient, any one of polyfunctional phenol compounds such as polyphenol-based compounds and phenolic novolac-based compounds; and an epoxy resin containing, as an ingredient, any one of dicyclopentadiene-phenol polyaddition products. Instead of these epoxy resins, any one of phenol resins, acrylic resins and resins obtained by mixing these resins together may be used as the thermosetting resin.

Moreover, the second resin which has the sea-island structure between the second resin and the thermosetting first resin is not limited to the silicone resin described with regard to the foregoing embodiments. According to the type of thermosetting first resin, a silicone resin may be selected whenever deemed necessary.

Additionally, Pb-free solder should preferably be used as the solder to bond the tab onto the top of the collector electrode. In a case where the Pb-free solder is used, the melting point of the solder is higher than that of the conventional solder. Nevertheless, the present invention is capable of reducing the thermal effect which is caused at the time of soldering, because the present invention is capable of providing the solar cell including the collector electrode in which the internal electrode is small in amount. For this reason, the present invention is highly useful particularly when the Pb-free solder is used.

In addition, the foregoing embodiments each use silver as the conductive material contained in the resin paste. However, the conductive material is not limited to silver. Conductive materials can be used, including: metals such as copper, nickel and aluminum; silver-coated metals; carbon; and the like.

Furthermore, the foregoing embodiments each use the ITO film as the transparent conductive film, Instead, a transparent conductive film made of another material, for example, ZnO and IZO films can be used.

Moreover, the foregoing descriptions have been provided for the solar cell, each in which the photoelectric conversion part configured to perform the photoelectric converting function includes a p-n junction configured of the n type single-crystal silicon substrate and the p type amorphous semiconductors. However, the solar cells are not limited to this type. The present invention is also applicable to: a solar cell including a p-n junction or a p-i-n junction, which are each configured of polycrystalline semiconductors such as polycrystalline silicon, amorphous semiconductors such as amorphous silicon, compound semiconductors, or the like; a dye sensitizing solar cell; and an organic solar cell.

As described above, the embodiments of the present invention can be modified variously within the scope of technical ideas as set out in the claims whenever deemed necessary.

FIELD OF THE INDUSTRIAL APPLICATION

As described above, the present invention is capable of providing a solar cell and a solar cell module, both which are less susceptible to a change in the environment, and both which exhibit increased reliability that lasts for a longer time.

The invention claimed is:

1. A solar cell comprising:
a photoelectric conversion part having a photoelectric converting function; and
a collector electrode provided at parts of a surface of the photoelectric conversion part, wherein
interconnection tabs are connected at a first surface of the collector electrode with a solder or an adhesive, the first surface is an opposite surface to a second surface facing the photoelectric conversion part,
the collector electrode includes a first layer and a second layer adjacent to the first layer between the solder or the adhesive and the photoelectric conversion part, wherein
the first and the second collector electrode layers contain a thermosetting first resin, a conductive material and a second resin for forming a sea-island structure between the second resin and the first resin, and
a concentration ratio of the second resin to the first resin is higher in the second layer than in the first layer.

2. The solar cell according to claim 1, characterized in that
the first resin is an epoxy resin, and
the second resin is a silicone resin.

3. The solar cell according to claim 1, wherein the collector electrode further includes a third layer formed on one surface of the second layer that faces opposite to the first layer, and wherein
a concentration ratio of the second resin to the first resin is higher in the second layer than in the first and the third layers.

4. The solar cell according to claim 1,
further comprising a transparent conductive film on the surface of the photoelectric conversion part, wherein
the collector electrode is on parts of a surface of the transparent conductive film.

5. The solar cell of claim 1, wherein the collector electrode has a thickness of between about 10 microns and about 50 microns.

6. The solar cell of claim 1, wherein the first layer has a thickness of about 10 microns to about 50 microns.

7. The solar cell of claim 1, wherein the second layer has a thickness of about 10 microns to about 50 microns.

8. A solar cell module formed by the sealing of a plurality of solar cells between a glass and a resin film with a sealing member, the plurality of solar cells being electrically connected one to another with interconnection tabs, wherein
each of the solar cells includes a photoelectric conversion part having a photoelectric converting function, and a collector electrode provided at the side of a surface of the photoelectric conversion part,
the interconnection tabs are connected at a first surface of the collector electrode with a solder or an adhesive, the first surface is a opposite surface to a second surface facing the photoelectric conversion part,
the collector electrode includes a first layer and a second layer adjacent to the first layer between the solder or the adhesive and the photoelectric conversion part, wherein
the first and the second layers contain a thermosetting first resin, a conductive material and a second resin for forming a sea-island structure between the second resin and the first resin, and
a concentration ratio of the second resin to the first resin is higher in the second layer than in the first layer.

9. The solar cell module according to claim 8,
further comprising a transparent conductive film on the surface of the photoelectric conversion part, characterized in that
the collector electrode is on parts of a surface of the transparent conductive film.

* * * * *